(12) United States Patent
Wehmeier

(10) Patent No.: US 9,287,826 B2
(45) Date of Patent: Mar. 15, 2016

(54) SINE-COSINE MODULATOR

(75) Inventor: Stefan Wehmeier, Recklinghausen (DE)

(73) Assignee: Conta Pronat GmbH, Recklingshausen (DE)

( * ) Notice: Subject to any disclaimer, the term of this patent is extended or adjusted under 35 U.S.C. 154(b) by 0 days.

(21) Appl. No.: 14/425,055

(22) PCT Filed: Sep. 4, 2012

(86) PCT No.: PCT/EP2012/003689
§ 371 (c)(1),
(2), (4) Date: May 2, 2015

(87) PCT Pub. No.: WO2014/037017
PCT Pub. Date: Mar. 13, 2014

(65) Prior Publication Data
US 2015/0236646 A1 Aug. 20, 2015

(51) Int. Cl.
*H03C 3/02* (2006.01)
*H03F 3/217* (2006.01)

(52) U.S. Cl.
CPC .................. *H03C 3/02* (2013.01); *H03F 3/217* (2013.01); *H03F 3/2171* (2013.01)

(58) Field of Classification Search
CPC ........ H03K 7/08; H02M 3/338; H02M 3/156; H03F 3/217; H03F 3/2171
USPC ............. 327/336, 172, 129; 323/284; 363/13, 363/18; 330/251, 260
See application file for complete search history.

(56) References Cited

U.S. PATENT DOCUMENTS 8,766,616 B2 * 7/2014 Oyama .......................... 323/284

FOREIGN PATENT DOCUMENTS

EP 2391002 A1 11/2011
JP 2001127562 A 5/2001

OTHER PUBLICATIONS

Jun Yu et al.: "A Dual-Feedforward Carrier Modulated Second-Order Class-D Amplifier with Improved THD", IEEE Transactions on Circuits and Systems II: Epress Briefs, IEEE, US, vol. 59, No. 1, Jan. 1, 2012, pp. 35-39, XP011397557, ISSN: 1549-7747, DOI: 10.1109/TCSII.2011.2173973, Figure 3.

* cited by examiner

*Primary Examiner* — Arnold Kinkead
(74) *Attorney, Agent, or Firm* — Michael Soderman

(57) ABSTRACT

The invention relates to a self-oscillating pulse-width modulation amplifier in the form of a sine-cosine modulator (10) comprising at least two comparators (13, 14), two integrators (11, 12), a power switching stage (15), and negative feedback coupling with a low-frequency signal input and output. To achieve a maximum modulation factor, there are provisions with the aid of the comparators (13, 14) and integrators (11, 12) for the generation of sine- and cosine-square-wave voltages and sine- and co-sine-triangle-wave voltages that drive the power switching stage (15) in part, wherein the output of the power switching stage (15) combined with an LC low-pass filter (16) forms the low-frequency signal output. This brings about a situation in which a stable natural frequency exists and the modulation factor can be increased to nearly 100%. At the same time, a very low level of distortion is achieved and no distortion components higher than K3 arise, so there is a significant improvement vis-a-vis the known pulse-width modulation amplifiers.

9 Claims, 16 Drawing Sheets

SINE-COSINE MODULATOR

CROSS-REFERENCE TO RELATED APPLICATIONS

This application is the U.S. national stage of International Application No. PCT/EP2012/003689 filed on Sep. 4, 2012, and claims the benefit thereof.

BACKGROUND

The invention relates to a sine-cosine modulator comprising at least two comparators, two integrators, a power switching stage, an LC low-pass filter, and a low-frequency signal input or control-voltage input and a low-frequency signal output or DC voltage output.

Analog power amplifiers for low-frequency AC voltages in the audio-frequency range or voltage stabilizers are replaced in a number of applications in the prior art with pulse-width modulation amplifiers or switched-mode voltage converters that have a significantly higher level of thermal efficiency vis-a-vis the analog circuits. Self-oscillating pulse-width modulation amplifiers have better signal-processing or sound quality than clocked pulse-width modulation amplifiers that are driven by an external oscillator.

A self-oscillating pulse-width modulation amplifier of this type that not only has a significantly higher level of thermal efficiency vis-a-vis analog power amplifiers, but also better sound quality, is described in DE 198 38 765 A1 ("Selbstschwingender Digitalverstärker" ["Self-Oscillating Digital Feedback Amplifier"]). A drawback is that the natural frequency f is dependent upon the modulation factor with the relationship $f = f_0 * (1-M^2)$. The modulation factor or excitation factor is consequently limited to approx. 60% in practice.

SUMMARY

The invention relates to a self-oscillating pulse-width modulation amplifier in the form of a sine-cosine modulator 10 comprising at least two comparators 13, 14, two integrators 11, 12, a power switching stage 15, and negative feedback coupling with a low-frequency signal input and output. To achieve a maximum modulation factor, there are provisions with the aid of the comparators 13, 14 and integrators 11, 12 for the generation of sine- and cosine-square-wave voltages and sine- and cosine-triangle-wave voltages that drive the power switching stage 15 in part, wherein the output of the power switching stage 15 combined with an LC low-pass filter 16 forms the low-frequency signal output. This brings about a situation in which a stable natural frequency exists and the modulation factor can be increased to nearly 100%. At the same time, a very low level of distortion is achieved and no distortion components higher than K3 arise, so there is a significant improvement vis-a-vis the known pulse-width modulation amplifiers.

DETAILED DESCRIPTION

The task of the present invention is to make the natural frequency f of a self-oscillating pulse-width modulation amplifier independent of the modulation factor M and to therefore increase the maximum modulation factor or excitation factor to nearly 100% and to simultaneously further improve the sound quality.

The problem is solved in accordance with the invention by setting up a function generator for the simultaneous generation of sine- and cosine-oscillations with two comparators and two integrators that generate sine- and cosine-square-wave and sine- and cosine-triangle-wave voltages, which drive the power switching stage in part; the output of the power switching stage combined with an LC low-pass filter forms the low-frequency signal output or the DC voltage output. Further advantageous design forms can be found in the sub-claims.

The sine-cosine modulator is comprised, in a tried-and-tested form, of a function generator for the simultaneous generation of sine- and cosine-oscillations. The problem-free amplitude stabilization of the function generator can be used in connection with this. Starting with a triangle-wave signal of an arbitrary function generator, the course of the algebraic sign is determined with a comparator and phase-shifted by 90 degrees vis-a-vis the square-wave signal. This square-wave signal can be transformed into a second triangle-wave signal, which is then likewise phase-shifted by 90 degrees, with the aid of a second integrator. Starting with this possibility of the function generator, a power switching stage is driven by the function generator, wherein the output of the power switching stage combined with an LC low-pass filter forms the low-frequency signal output.

The comparators and integrators are used to generate the square-wave or triangle-wave voltages; the first comparator is used to generate a sine-square-wave voltage and the first integrator is used to generate a sine-triangle-wave voltage, whereas the second comparator is used to generate a cosine-square-wave voltage and the second integrator is used to generate a cosine-triangle-wave voltage. The second comparator for generating the cosine-square-wave voltage is preferably used for driving the power switching stage in connection with this. The sine-cosine modulator has negative feedback coupling here via a resistor from the output of the power switching stage to the input of the second integrator for generating a cosine-triangle-wave voltage. The low-frequency signal input is connected via a resistor with the input of the second integrator for generating a cosine-triangle-wave voltage, whereas the LC low-pass filter is connected to the output of the power switching stage and constitutes the low-frequency signal output.

In a further design form of the invention, there are provisions for the low-frequency output to be connected via a series RC element with the input of the second integrator for generating a cosine-triangle-wave voltage, in order to make the damping factor of the LC low-pass filter independent of the load connected to the low-frequency output.

A situation is achieved with the aid of the procedure that was described in which the sine-cosine modulator operates with a constant natural frequency of 400 kHz, for instance, so a maximum modulation factor or excitation factor of nearly 100% is achieved and only very slight nonlinear distortion arises. K2 and K3 remain in the inaudible range, whereas the higher distortion components K5 and K7 no longer arise in contrast to the prior art according to DE 198 38 765 A1.

The sine-cosine modulator can, as an example, be used with a low-frequency signal input and a low-frequency signal output as a pulse-width modulation amplifier. The natural frequency f of the sine-cosine modulator is kept constant independently of the modulation factor M via an "internal" square-triangle generator comprising a first integrator and a first comparator. At the same time, a second integrator that drives via the "internal" square-triangle generator a second comparator, which in turn drives the power switching stage, forms, together with the second comparator and the power switching stage, an "external" square-triangle generator that has negative feedback coupling via a resistor R5 from the output of the power switching stage to the input of the second integrator, whereas, on the other hand, a resistor R6 is provided as the input resistance for the low-frequency signal voltage $V_{Input}$ at the input of the second integrator. The output signal $V_{Output}$ is picked up after an LC low-pass filter in connection with this. The voltage amplification $V_{Output}$ divided by $V_{Input}$ is determined by the resistance ratio $-R5/R6$ here.

Alternatively, the possibility exists of using the sine-cosine modulator as a switched-mode voltage converter; control takes place via a control-voltage input, and the desired output voltage is available at a DC voltage output. This involves the advantage that there is additional negative feedback coupling via a resistor and a capacitor, in order to make the damping factor of the LC output filter independent of the load that is connected. This combination of "internal" negative feedback coupling via a resistor and "external" negative feedback coupling via a resistor and a capacitor leads to very quick control behavior.

The invention consequently involves a sine-cosine modulator, wherein sine- and cosine-square-wave voltages and sine- and cosine-triangle-wave voltages are generated with the aid of the comparators and integrators, driving the power switching stage in part, wherein the output of the power switching stage combined with an LC low-pass filter constitutes the low-frequency signal output and wherein the second comparator for generating the cosine-square-wave voltage drives the power switching stage and the sine-cosine modulator has negative feedback coupling via a resistor from the output of the power switching stage to the input of the second integrator for generating a cosine-triangle-wave voltage and the low-frequency signal input is connected via a resistor to the input of the second integrator for generating a cosine-triangle-wave voltage.

This circuit distinguishes itself by especially low nonlinear distortion; the natural frequency f is independent of the modulation factor M, so a maximum modulation factor or excitation factor of nearly 100% is achieved. The sine-cosine modulator consequently represents a significant improvement vis-a-vis prior pulse-width modulation amplifiers.

BRIEF DESCRIPTION OF THE DRAWINGS

The invention is explained once again below with the aid of the figures.

DETAILED DESCRIPTION OF THE PREFERRED EMBODIMENTS

Figure 1:
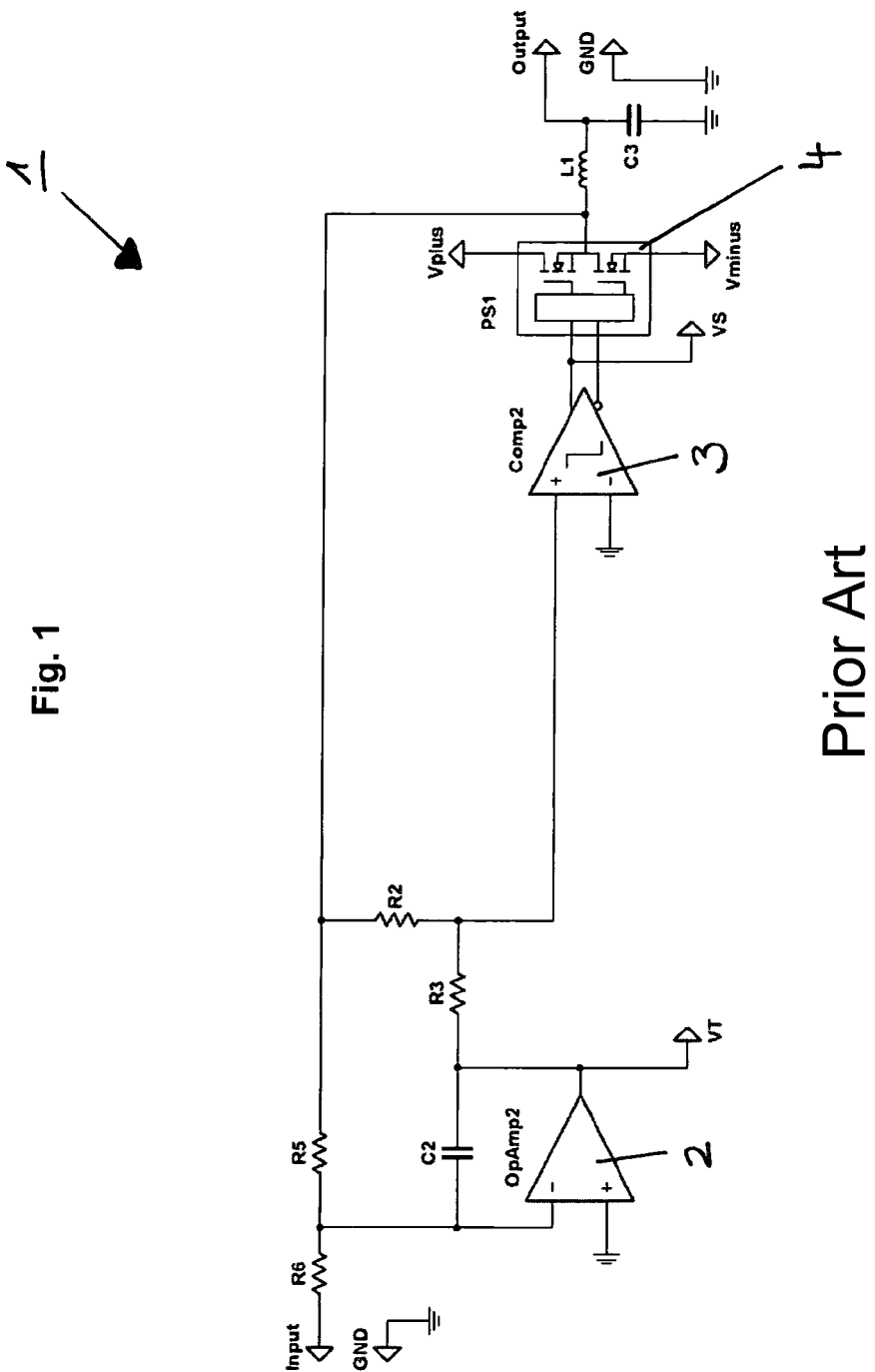
FIG. 1 shows a self-oscillating pulse-width modulator according to the prior art.

FIG. 1 shows a circuit diagram of a self-oscillating pulse-width modulator 1 in the form of a pulse-width modulation amplifier. The pulse-width modulator 1 comprises an integrator 2 and a comparator 3 in this case; the comparator 3 is provided to drive the power switching stage 4. An example that is known in the prior art is involved in this case. The pulse-width modulator 1 serves to simultaneously generate triangle- and square-wave oscillations and was extended with a power switching stage 4, negative feedback coupling, a low-frequency signal input, an LC low-pass filter and a low-frequency signal output; this is called a "self-oscillating digital feedback amplifier" below, SODFA for short, in order to illustrate the advantages of the sine-cosine modulator vis-a-vis the prior art.

Figure 2:
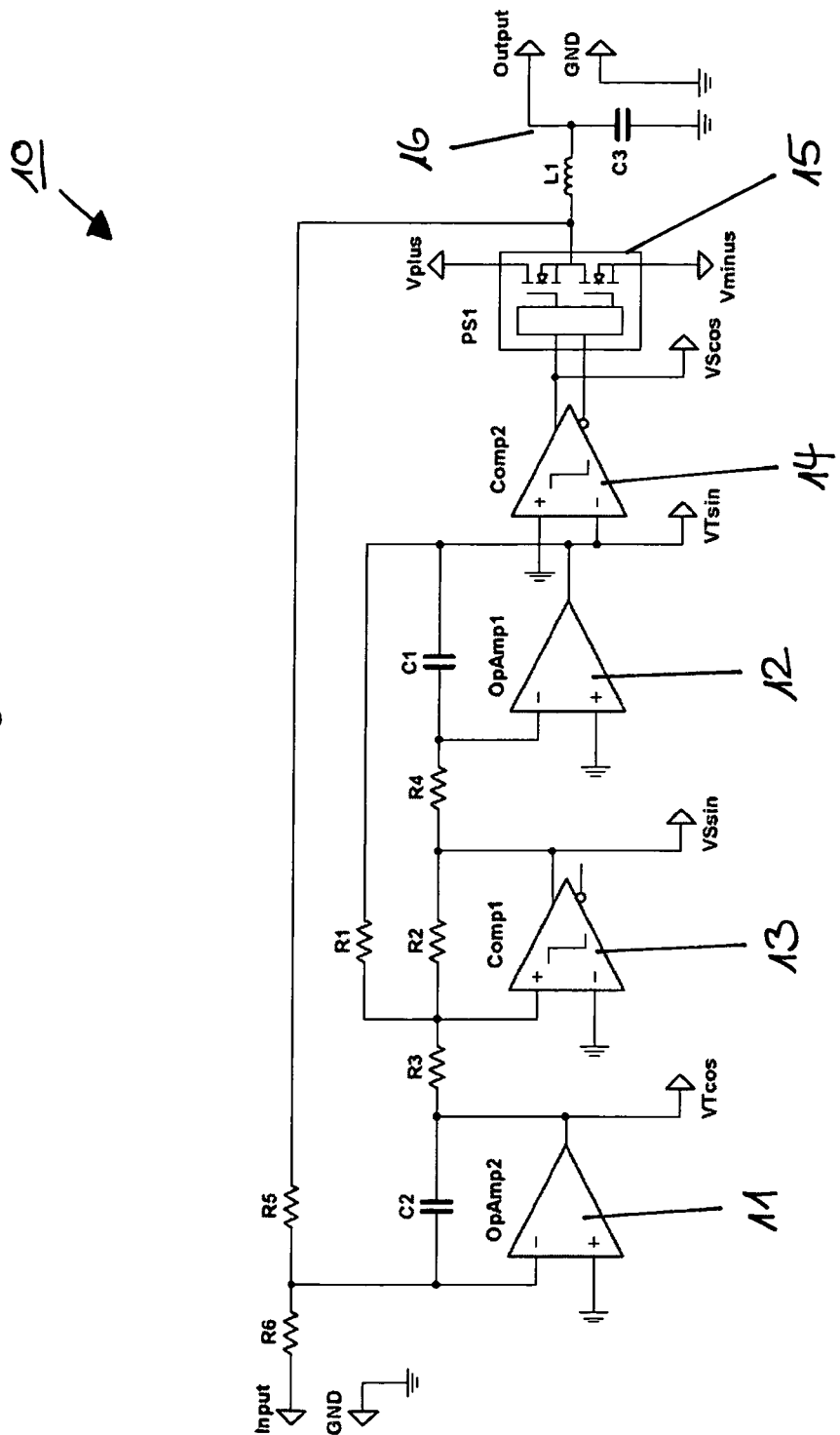
FIG. 2 shows a sine-cosine modulator in the form of a self-oscillating pulse-width modulation amplifier with a constant natural frequency independent of the modulation factor.

FIG. 2 shows an example of a sine-cosine modulator 10 in the form of a pulse-width modulation amplifier with two integrators 11, 12 and two comparators 13, 14, as well as a power switching stage 15. The integrator 12 generates the signal $V_{T\,sin}$ and forms, together with the comparator 13 that generates the signal $V_{S\,sin}$, an "internal" square-triangle-wave generator that holds the natural frequency f of the sine-cosine modulator constant independently of the modulation factor M. At the same time, the integrator 11 that generates the signal $V_{T\,cos}$ and that drives via the "internal" square-triangle-wave generator the comparator 14, which generates the signal $V_{S\,cos}$ and which drives the power switching stages 15, forms, together with the comparator 14 and the power switching stage 15, an "external" square-triangle-wave generator that has negative feedback coupling via a resistor R5 from the output of the power switching stage 15 to the input of the integrator 11, while a resistor R6 is provided as an input resistor, on the other hand, for the low-frequency signal voltage $V_{Input}$. The output signal $V_{Output}$ is picked up after an LC low-pass filter 16 in connection with this. The voltage amplification $V_{Output}$ divided by $V_{Input}$ is $-R5$ divided by R6.

Figure 3:
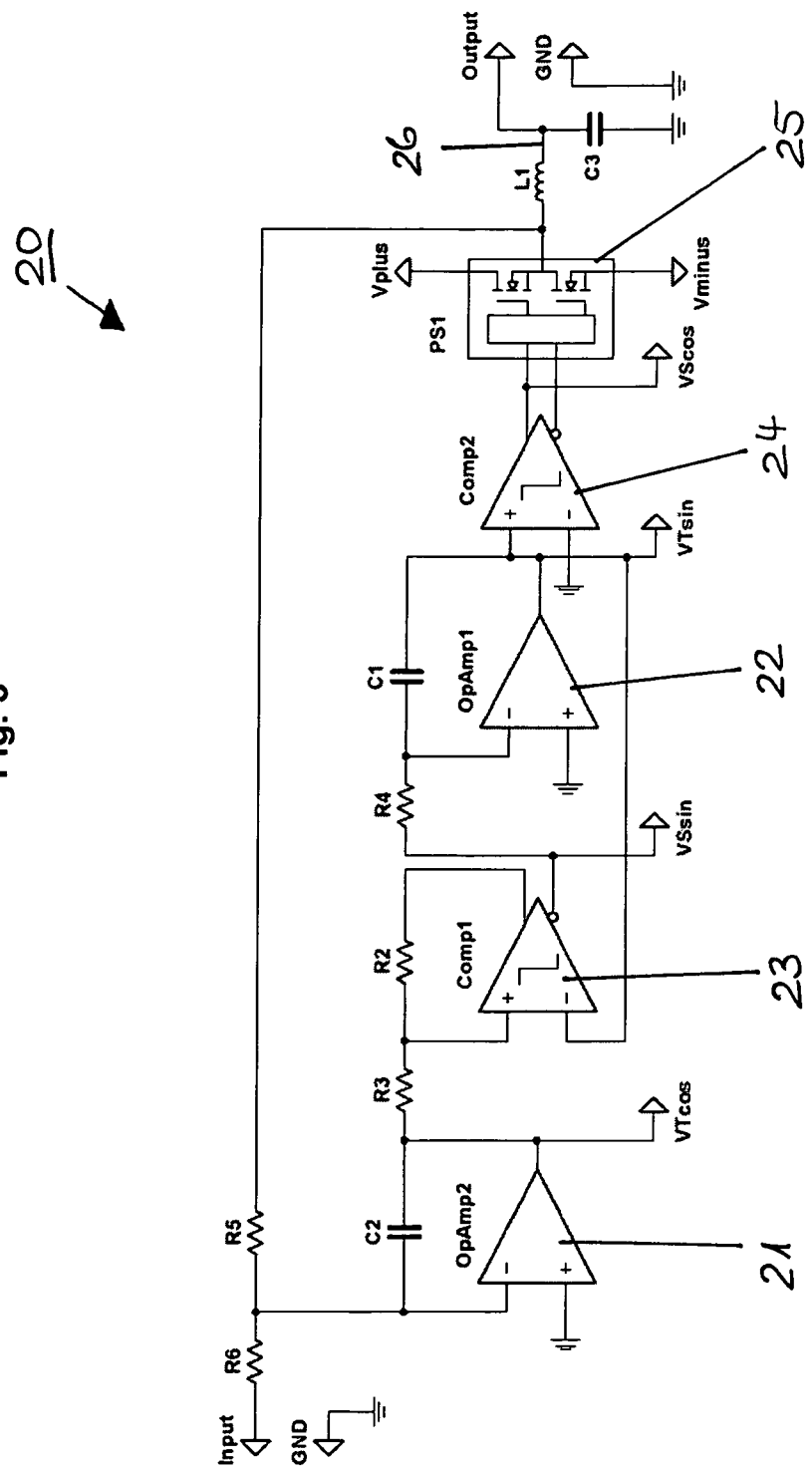
FIG. 3 shows a circuit variant of a sine-cosine modulator in accordance with FIG. 2 for a first comparator with two complementary outputs.

FIG. 3 shows an alternative circuit example of a sine-cosine modulator 20 in the form of a pulse-width modulation amplifier with two integrators 21, 22 and two comparators 23, 24, as well as a power switching stage 25. A first comparator 23 with two complementary outputs is used in this circuit variant; an output for feedback and the complementary output for generating the signal $V_{S\ sin}$ and for driving the integrator 22, which generates the signal $V_{T\ sin}$, are provided.

Figure 4:
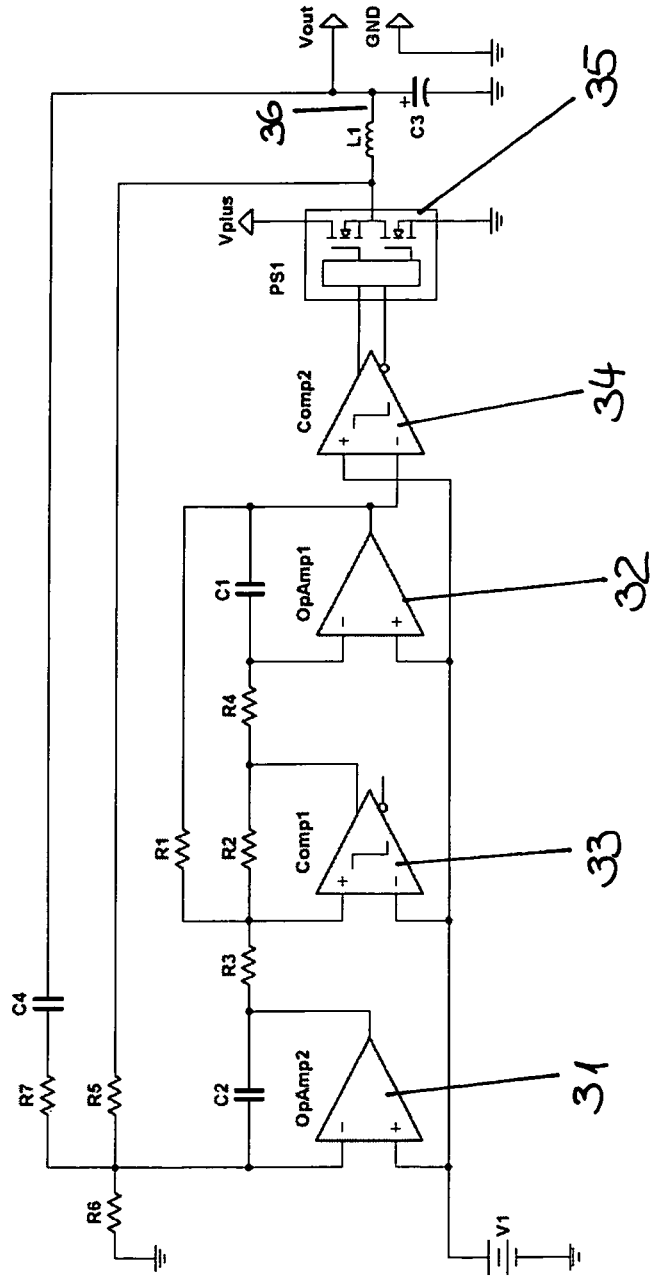
FIG. 4 shows a sine-cosine modulator in accordance with FIG. 2 in the form of a switched-mode voltage converter with additional feedback.
Figure 5:
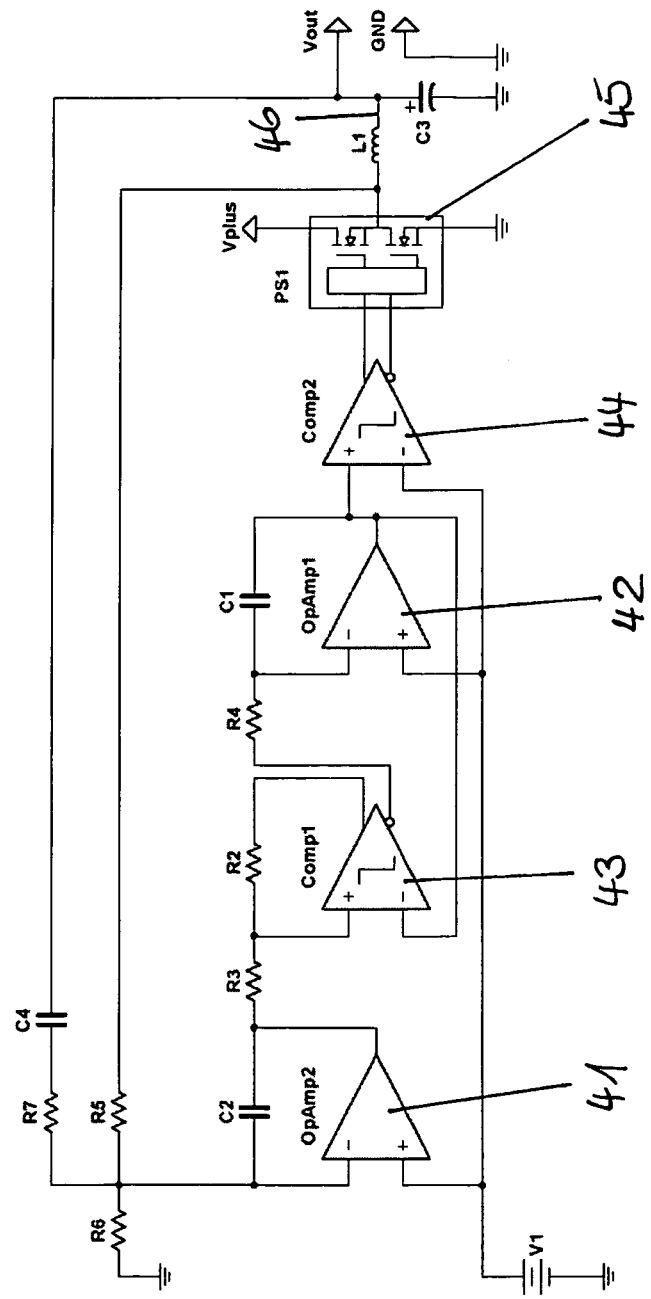
FIG. 5 shows a sine-cosine modulator in accordance with FIG. 3 in the form of a switched-mode voltage converter with additional feedback.
Figure 6:
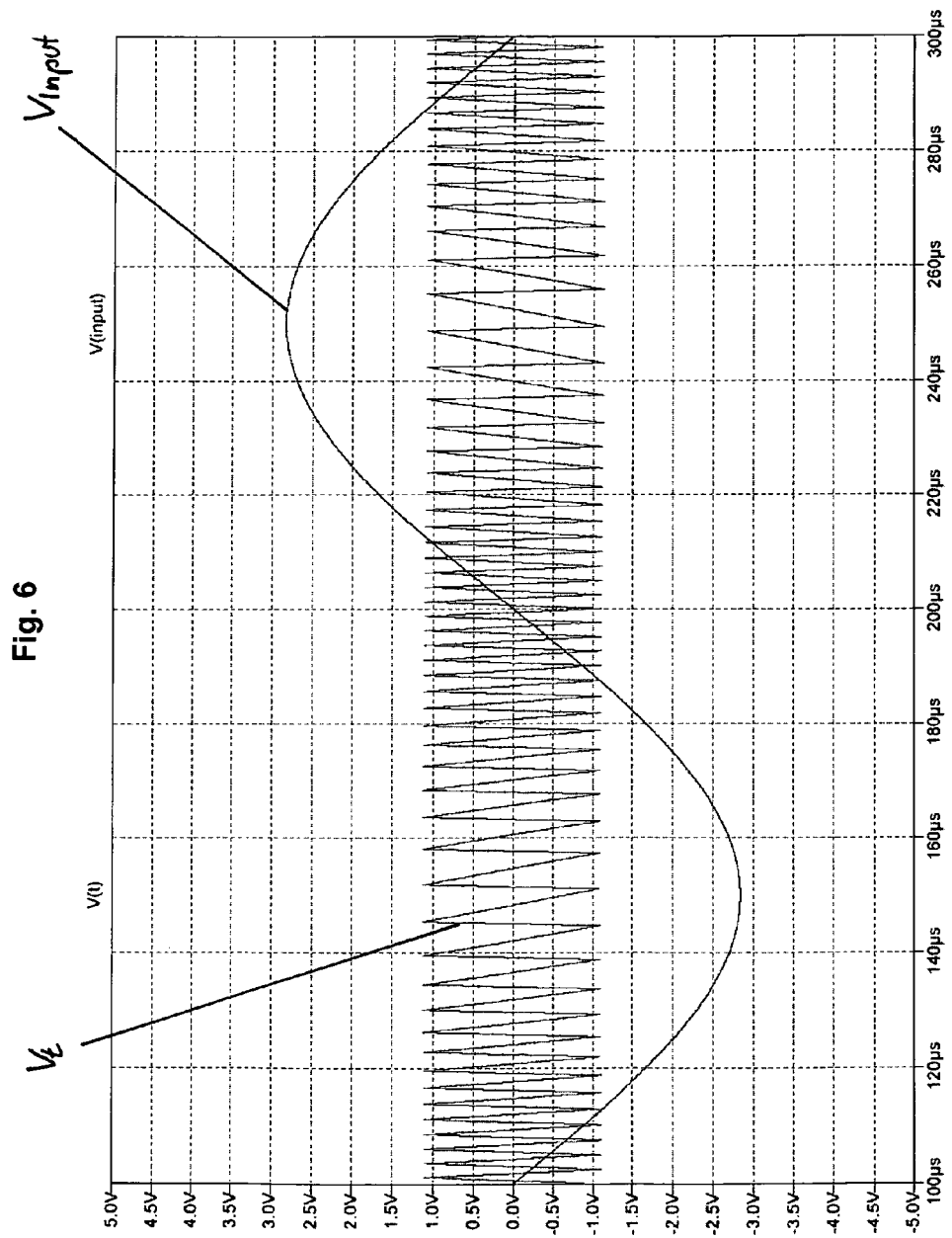
FIG. 6 shows the oscillation behavior of the self-oscillating pulse-width modulator according to the prior art at $M_{max}=0.79$ over the period of a 5 kHz input sinusoidal signal.

FIG. 4 shows an example of a sine-cosine modulator 30 in the form of a regulated switched-mode voltage converter (synchronous buck regulator) that is once again operated with two integrators 31, 32 and two comparators 33, 34, as well as a power switching stage 35. Compared with the design variant in accordance with FIG. 2, additional negative feedback coupling is provided in this case via a resistor R7 and a capacitor C4 in order to make the damping factor of the LC output filter independent of the load that is connected. This combination of "internal" negative feedback coupling via R5 and "external" negative feedback coupling via R7 and C4 leads to very quick control behavior (integral-derivative controller) that is superior to the regulation behavior of conventional PID (proportional-integral-derivative) controllers with only one instance of negative feedback coupling. The following applies to the regulated output voltage: $V_{out}=V1*(1+R5/R6)$ FIG. 5 shows an alternative circuit example of a sine-cosine modulator 40 in the form of a regulated switched-mode voltage converter that is operated based on the embodiment in accordance with FIG. 3 with two integrators 41, 42 and two comparators 43, 44, as well as a power switching stage 45. Additional negative feedback coupling is also provided in this case with a series RC element via a resistor R7 and a capacitor C4. In this design variant, the comparator 43 with two complementary outputs is used; one output is provided for feedback once again, whereas the complementary output generates the voltage $V_{S\ sin}$ and drives the integrator 42, which generates the signal $V_{T\ sin}$. The control behavior is also significantly improved vis-a-vis conventional PID controllers in this case, and the following applies to the regulated output voltage: $V_{out}=V1*(1+R5/R6)$ FIG. 6 shows the signal shapes $V_{Input}$ and $V_T$ of the self-oscillating pulse-width modulator 1 (SODFA) at a natural frequency $f=400\ kHz*(1-M^2)$ and $M_{max}=0.79$ over the period of a 5 kHz input sinusoidal signal.

Figure 7:
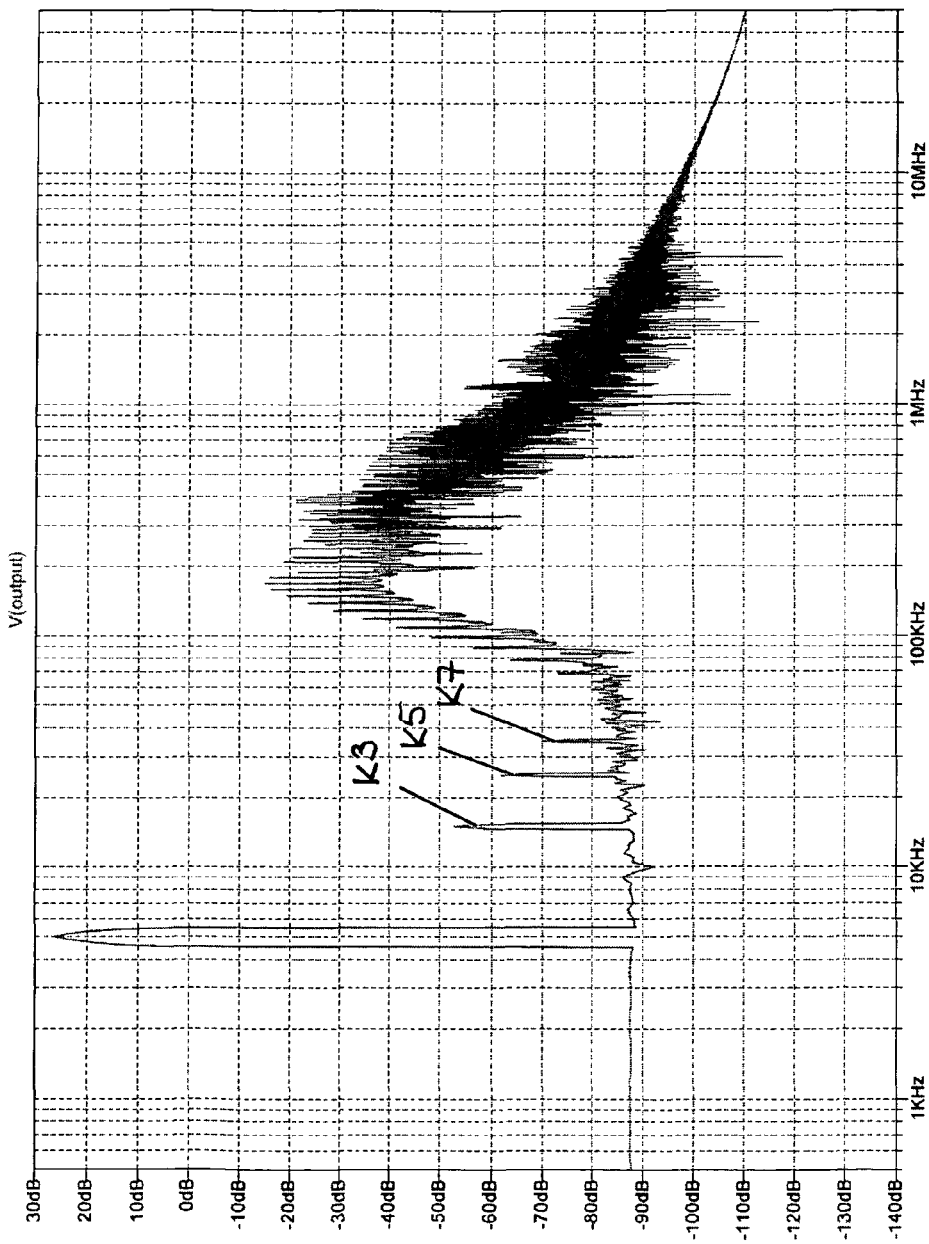
FIG. 7 shows the frequency spectrum of the self-oscillating pulse-width modulator according to the prior art behind the LC low-pass filter.

FIG. 7 shows the frequency spectrum of the output signal of the SODFA behind the LC low-pass filter. The natural frequency of the SODFA "blurs" between 150 kHz and 400 kHz, and additional distortion components K5 and K7 arise.

Figure 8:
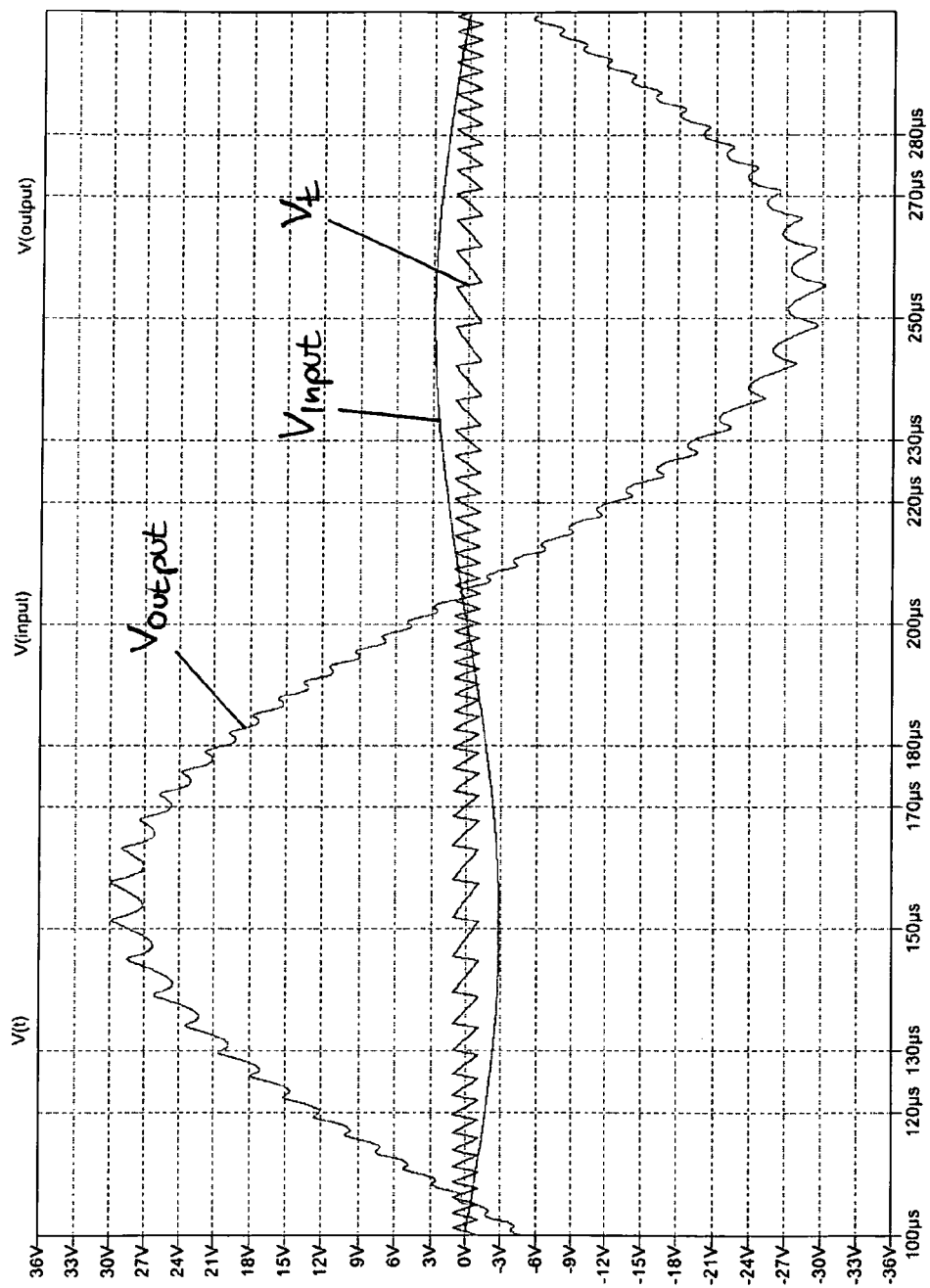
FIG. 8 shows the oscillation behavior of the self-oscillating pulse-width modulator according to the prior art with $V_{Input}$ and $V_{Output}$.

FIG. 8 shows the oscillation behavior of the SODFA at a maximum modulation factor of 0.79. The triangle-wave control signal $V_T$ remains centered around the zero point, whereas the natural frequency drops to the minimum value of $f_{min}=400\ kHz*(1-0.79^2)=150\ kHz$. The significantly increased ripple voltage at the output of the SODFA at the peaks of the sinusoidal wave of $V_{Output}$ can be recognized here because of the periodic drop of the natural frequency $f_0$ to $f_{min}=150\ kHz$.

Figure 9:
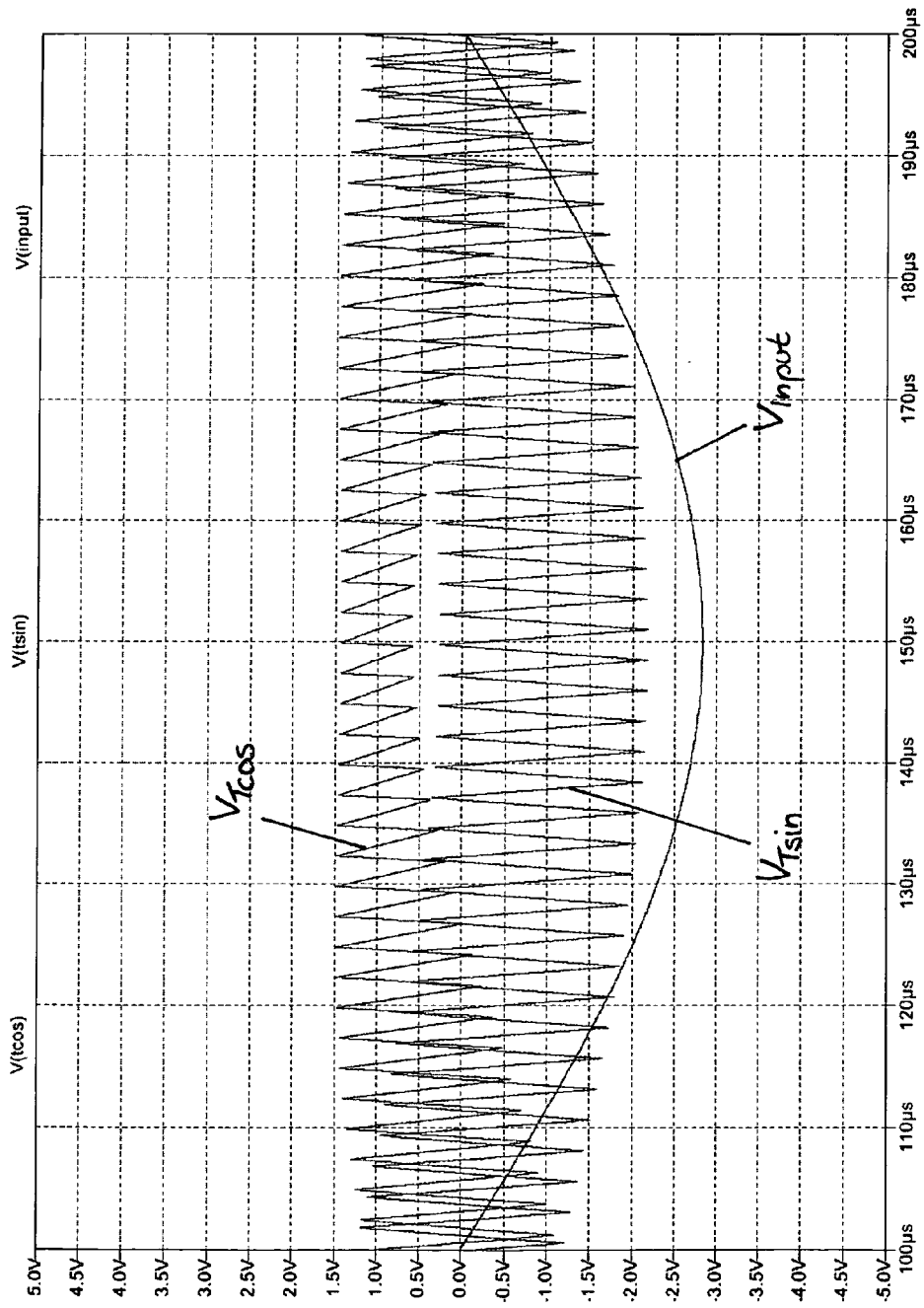
FIG. 9 shows the oscillation behavior of the sine-cosine modulator as per the invention in accordance with FIG. 2 at $M_{max}=0.79$ over a half period of a 5 kHz input sinusoidal signal.

FIG. 9 shows the oscillation behavior of the sine-cosine modulator 10 as per the invention in accordance with FIG. 2 with the signals $V_{T\ sin}$, $V_{T\ cos}$ and $V_{Input}$ at $M_{max}=0.79$ over a half period of a 5 kHz input sinusoidal signal. The control signal $V_{T\ cos}$ is shifted around the zero point in phase opposition to $V_{Input}$ and reduced in amplitude in proportion with M, as well as pulse-width modulated, whereas the control signal $V_{T\ sin}$ is shifted around the zero point in phase with $V_{Input}$ and remains constant with regard to amplitude and symmetry. The natural frequency f remains constant at 400 kHz independently of the modulation factor M.

Figure 10:
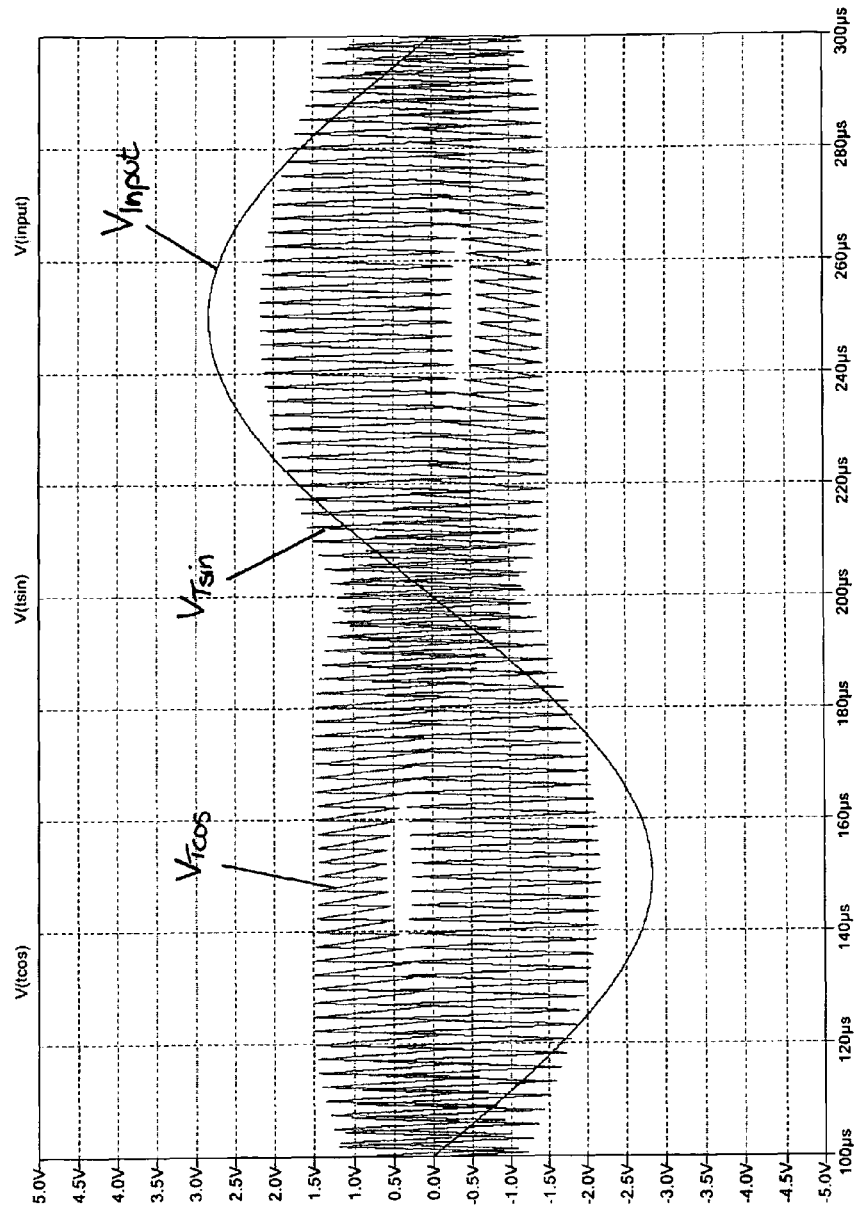
FIG. 10 shows the oscillation behavior of the sine-cosine modulator as per the invention in accordance with FIG. 2 at $M_{max}=0.79$ over a full period of a 5 kHz input sinusoidal signal.

FIG. 10 shows the oscillation behavior of the sine-cosine modulator 10 as per the invention in accordance with FIG. 2 with the signals $V_{T\ sin}$, $V_{T\ cos}$ and $V_{Input}$ at $M_{max}=0.79$ to illustrate the operational process over the full period of a 5 kHz input sinusoidal signal.

Figure 11:
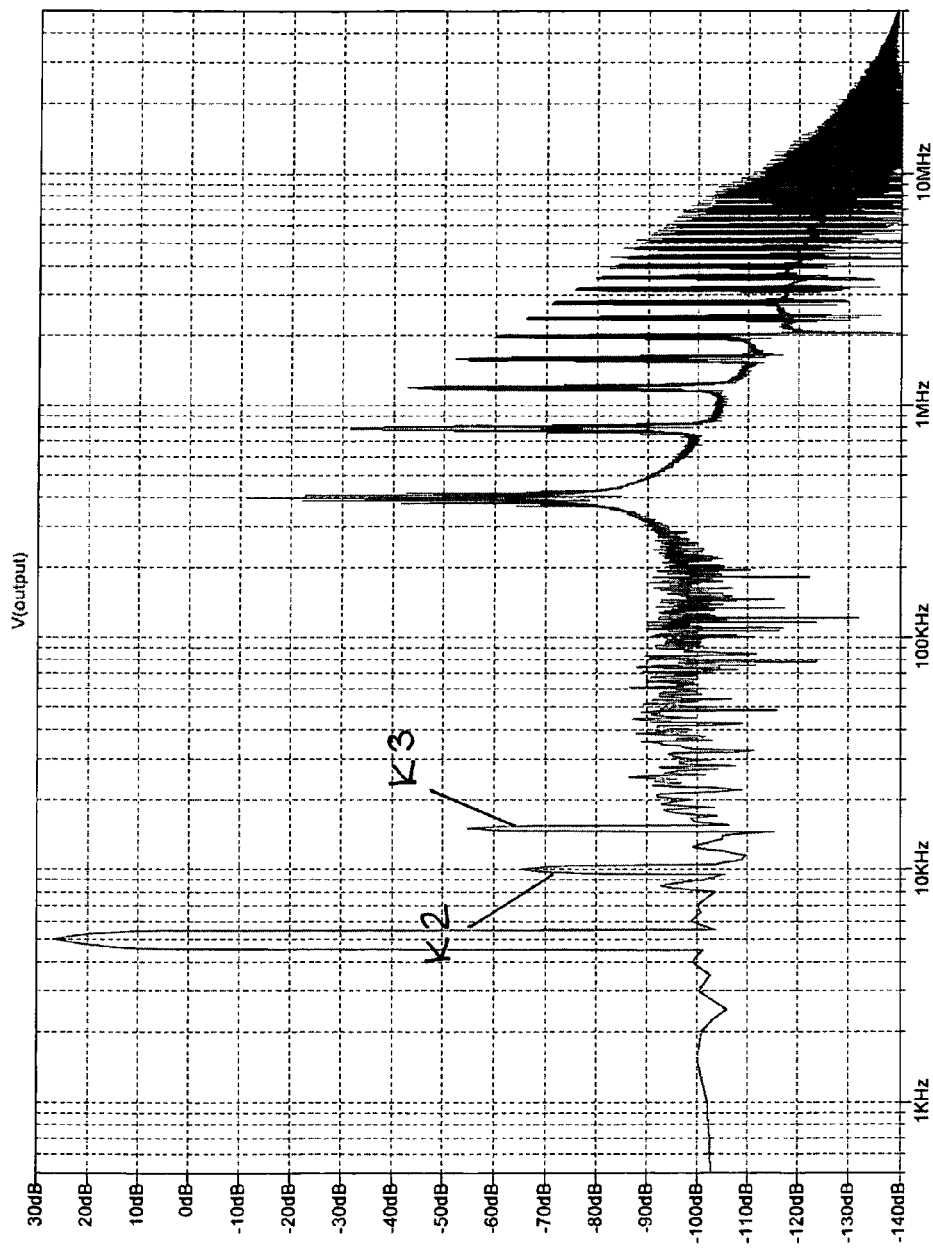
FIG. 11 shows the frequency spectrum of the sine-cosine modulator as per the invention in accordance with FIG. 2 behind the LC low-pass filter.

FIG. 11 shows the frequency spectrum of the sine-cosine modulator 10 as per the invention in accordance with FIG. 2 behind the LC low-pass filter. The natural frequency f remains at a constant 400 kHz independently of the modulation factor, and no additional distortion components K5 and K7 arise.

Figure 12:
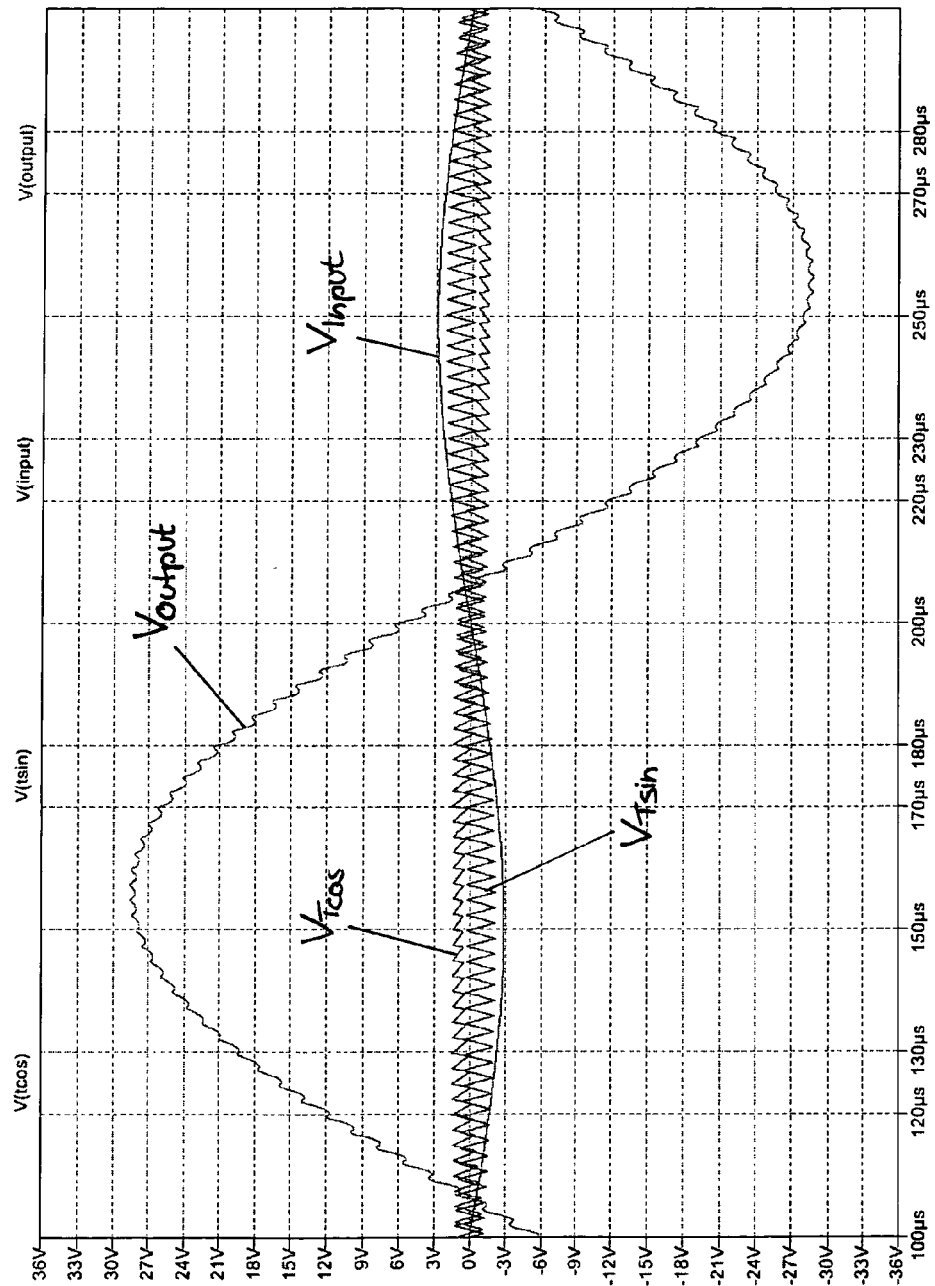
FIG. 12 shows the oscillation behavior of the sine-cosine modulator as per the invention in accordance with FIG. 2 with $V_{Input}$ and $V_{Output}$.

FIG. 12 shows the oscillation behavior of the sine-cosine modulator 10 as per the invention in accordance with FIG. 2 with the signals $V_{Input}$, $V_{T\ sin}$, $V_{T\ cos}$ and $V_{Output}$ with sinusoidal modulation at $M_{max}=0.79$ without a drop in the natural frequency f and therefore with a significantly less ripple voltage.

Figure 13:
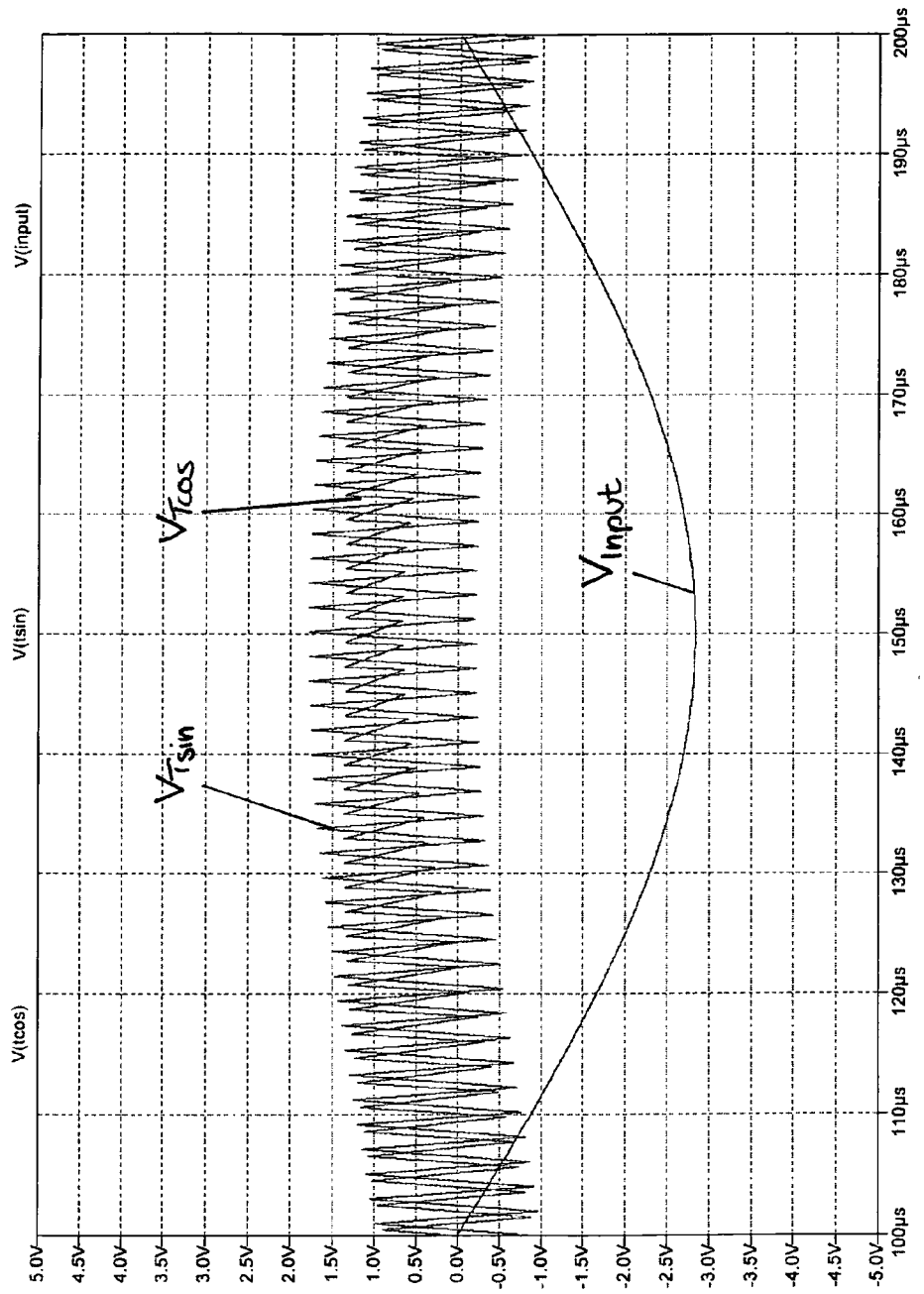
FIG. 13 shows the oscillation behavior of the sine-cosine modulator as per the invention in accordance with FIG. 3 at $M_{max}=0.79$ over a half period of a 5 kHz input sinusoidal signal.

FIG. 13 shows the oscillation behavior of the sine-cosine modulator 20 as per the invention in accordance with FIG. 3 with the signals $V_{T\ sin}$, $V_{T\ cos}$ and $V_{Input}$ at $M_{max}=0.79$ over a half period of a 5 kHz input sinusoidal signal. The control signal $V_{T\ cos}$ is shifted around the zero point in phase opposition to $V_{Input}$ and reduced in amplitude in proportion with M, as well as pulse-width modulated, whereas the control signal $V_{T\ sin}$ is shifted around the zero point, likewise in phase opposition to $V_{Input}$, and once again remains constant with regard to amplitude and symmetry. The natural frequency f remains constant at 400 kHz independently of the modulation factor M.

Figure 14:
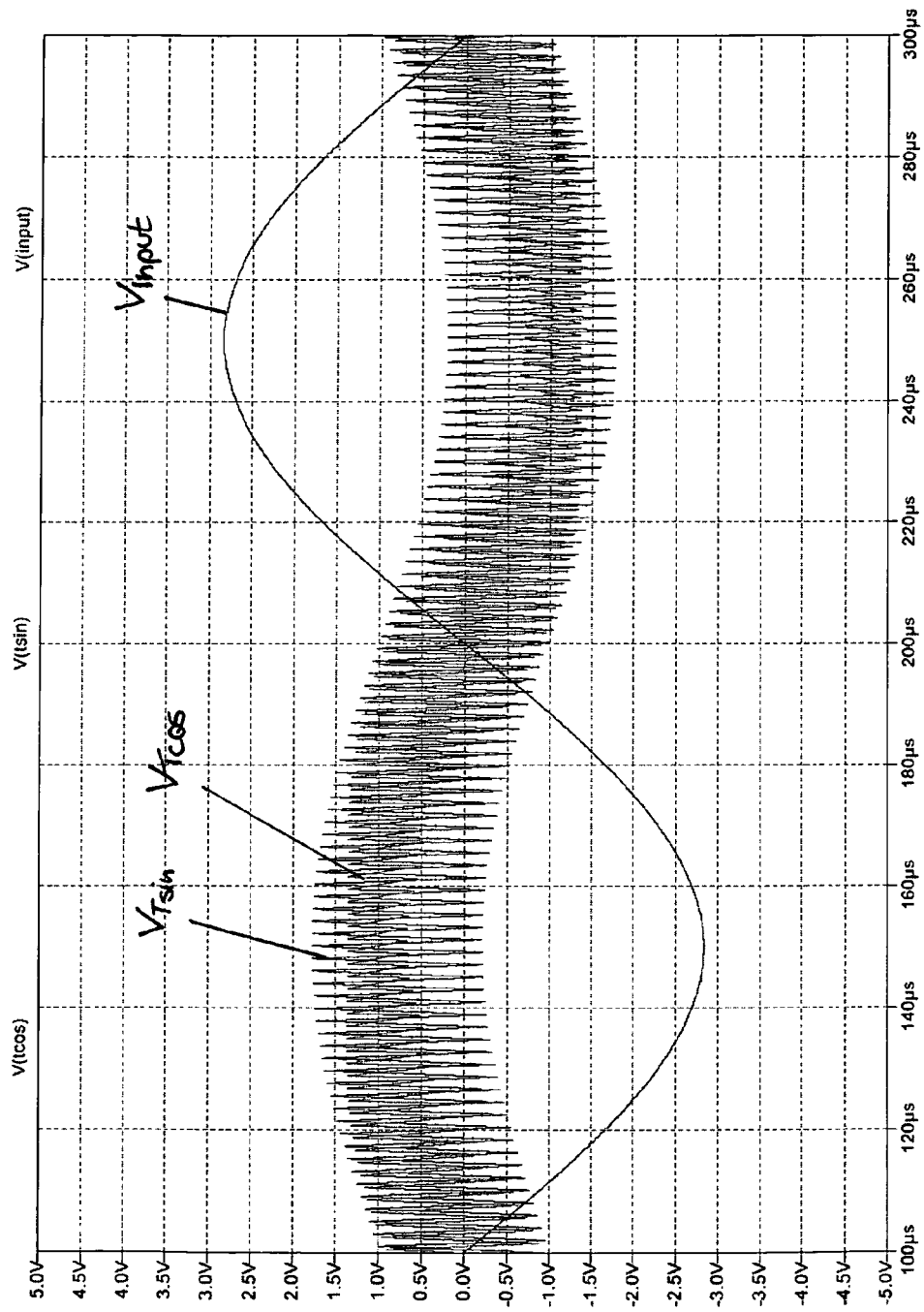
FIG. 14 shows the frequency spectrum of the sine-cosine modulator as per the invention in accordance with FIG. 3 at $M_{max}=0.79$ over a full period of a 5 kHz input sinusoidal signal.

FIG. 14 shows the oscillation behavior of the sine-cosine modulator 20 as per the invention in accordance with FIG. 3 with the signals $V_{T\ sin}$, $V_{T\ cos}$ and $V_{Input}$ at $M_{max}=0.79$ to illustrate the operational process over the full period of a 5 kHz input sinusoidal signal.

Figure 15:
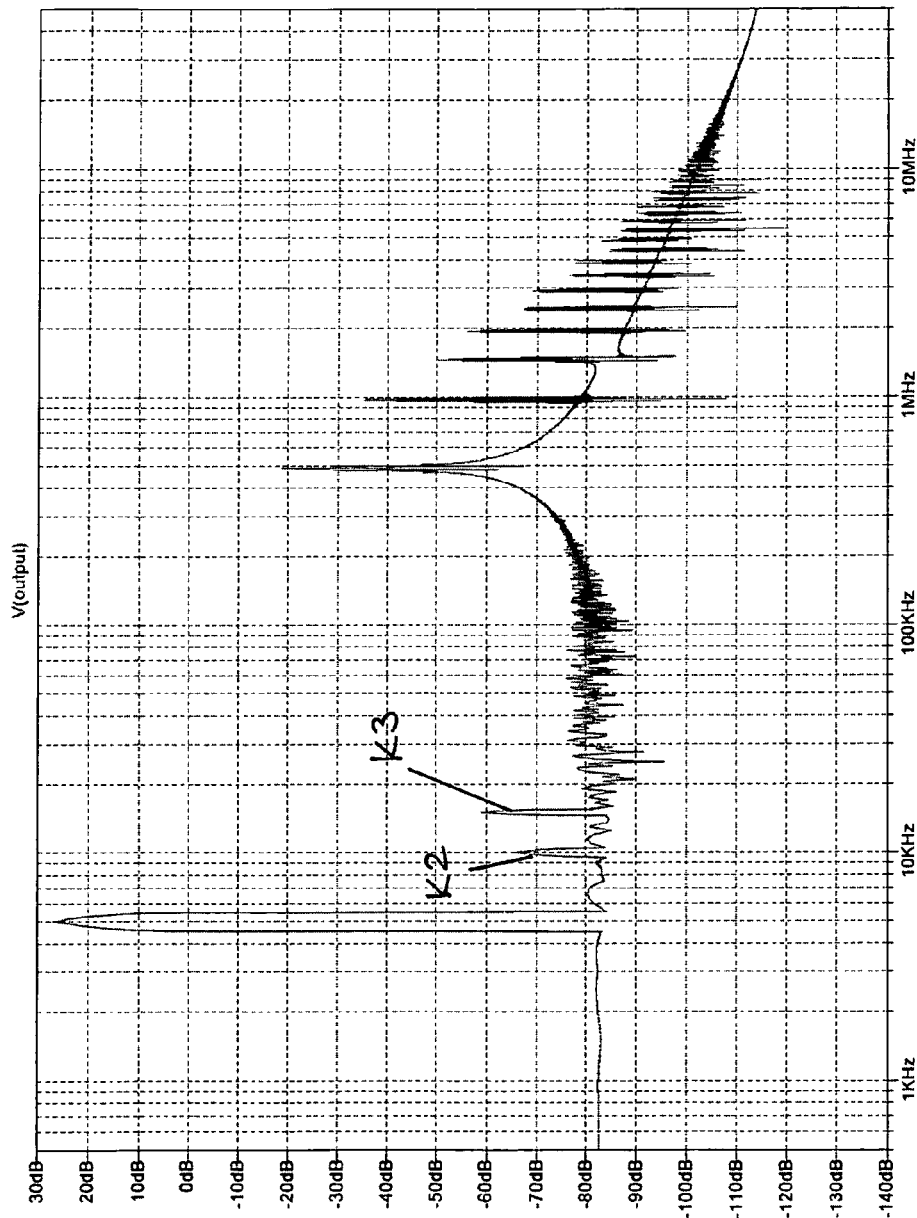
FIG. 15 shows the frequency spectrum of the sine-cosine modulator as per the invention in accordance with FIG. 3 behind the LC low-pass filter and FIG. 16 shows the oscillation behavior of the sine-cosine modulator as per the invention in accordance with FIG. 3 with $V_{Input}$ and $V_{Output}$.

FIG. 15 shows the frequency spectrum of the sine-cosine modulator 20 as per the invention in accordance with FIG. 3 behind the LC low-pass filter. The natural frequency f remains at a constant 400 kHz independently of the modulation factor, and no additional distortion components K5 and K7 arise.

Figure 16:
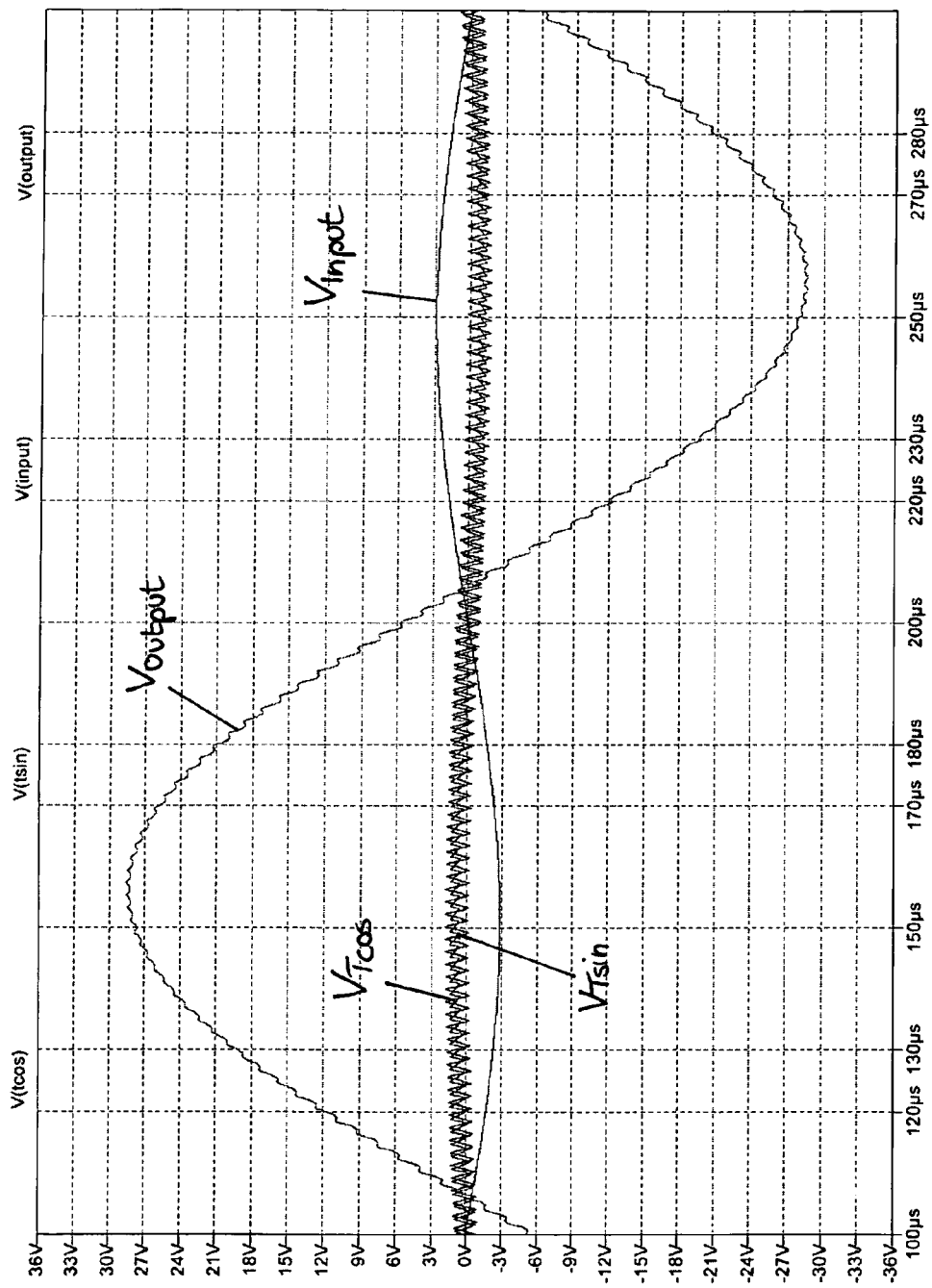

FIG. 16 shows the oscillation behavior of the sine-cosine modulator 20 as per the invention in accordance with FIG. 3 with the signals $V_{Input}$, $V_{T\ sin}$, $V_{T\ cos}$ and $V_{Output}$ with sinusoidal modulation at $M_{max}=0.79$ without a drop in the natural frequency f and therefore with a significantly less ripple voltage vis-a-vis the SODFA.

LIST OF REFERENCE NUMERALS

1 Pulse-width modulator
2 Integrator
3 Comparator
4 Power switching stage
10 Sine-cosine modulator
11 Integrator
12 Integrator
13 Comparator
14 Comparator
15 Power switching stage
16 LC low-pass filter
20 Sine-cosine modulator
21 Integrator
22 Integrator
23 Comparator
24 Comparator
25 Power switching stage
26 LC low-pass filter
30 Sine-cosine modulator
31 Integrator 32 Integrator
33 Comparator
34 Comparator
35 Power switching stage
36 LC low-pass filter
40 Sine-cosine modulator
41 Integrator
42 Integrator
43 Comparator
44 Comparator
45 Power switching stage
46 LC low-pass filter

The invention claimed is:

1. Sine-cosine modulator comprising a first integrator, a first comparator, a second integrator and a second comparator connected in series, said integrators and comparators also serving to create a phase shift of 90° with respect to their input signal, a power switching stage, an LC low-pass filter, as well as a low-frequency signal input or control-voltage input and a low-frequency signal output or DC voltage output,
wherein
a function generator for the simultaneous generation of sine- and cosine-oscillations through the first integrator, the first comparator, the second integrator and the second comparator is set up that generates sine- and cosine-square-wave voltages and sine- and cosine-triangle-wave voltages that drive the power switching stage in part, wherein the output of the power switching stage combined with an LC low-pass filter forms the low-frequency signal output or DC voltage output.

2. Sine-cosine modulator according to claim 1,
wherein
the first comparator is provided to generate a sine-square-wave voltage and the first integrator is provided to generate a sine-triangle-wave voltage, whereas the second comparator is provided to generate a cosine-square-wave voltage and the second integrator is provided to generate a cosine-triangle-wave voltage.

3. Sine-cosine modulator according to claim 1,
wherein
the second comparator for generating the cosine-square-wave voltage drives the power switching stage.

4. Sine-cosine modulator according to claim 1,
wherein
the sine-cosine modulator has negative feedback coupling via a resistor from the output of the power switching stage to the input of the second integrator for generating a cosine-triangle-wave voltage.

5. Sine-cosine modulator according to claim 1,
wherein
the low-frequency signal input is connected via a resistor to the input of the second integrator for generating a cosine-triangle-wave voltage.

6. Sine-cosine modulator according to claim 1,
wherein
the low-frequency signal output or DC voltage output is connected via a series RC element to the input of the second integrator for generating a cosine-triangle-wave voltage.

7. Sine-cosine modulator according to claim 1,
wherein
it has a low-frequency signal input and a low-frequency signal output in the form of a pulse-width modulation amplifier.

8. Sine-cosine modulator according to claim 1,
wherein
it has a control-voltage input and a DC voltage output in the form of a switched-mode voltage converter.

9. Sine-cosine modulator according to claim 1,
wherein
sine- and cosine-square-wave voltages and sine- and cosine-triangle-wave voltages are generated with the aid of the first and second comparators and first and second integrators, driving the power switching stage in part, that constitute a function generator for the simultaneous generation of sine- and cosine-oscillations, wherein the output of the power switching stage combined with an LC low-pass filter constitutes the low-frequency signal output and wherein the second comparator for generating the cosine-square-wave voltage drives the power switching stage and the sine-cosine modulator has negative feedback coupling via a resistor from the output of the power switching stage to the input of the second integrator for generating a cosine-triangle-wave voltage and the low-frequency signal input is connected via a resistor to the input of the second integrator for generating a cosine-triangle-wave voltage.

* * * * *